(12) United States Patent
Kraft

(10) Patent No.: US 12,133,031 B1
(45) Date of Patent: Oct. 29, 2024

(54) PORT-TO-PORT VISUAL IDENTIFICATION SYSTEM

(71) Applicant: James L. Kraft, York, PA (US)

(72) Inventor: James L. Kraft, York, PA (US)

( * ) Notice: Subject to any disclaimer, the term of this patent is extended or adjusted under 35 U.S.C. 154(b) by 119 days.

(21) Appl. No.: 17/734,542

(22) Filed: May 2, 2022

Related U.S. Application Data

(60) Provisional application No. 63/183,257, filed on May 3, 2021.

(51) Int. Cl.
*H04B 3/54* (2006.01)
*G01R 31/58* (2020.01)
*H04Q 1/02* (2006.01)
*H04Q 1/20* (2006.01)

(52) U.S. Cl.
CPC ............... *H04Q 1/20* (2013.01); *G01R 31/58* (2020.01); *H04B 3/54* (2013.01); *H04Q 1/13* (2013.01)

(58) Field of Classification Search
CPC . H04Q 1/20; H04Q 1/13; G01R 31/58; H04B 3/54
See application file for complete search history.

(56) References Cited

U.S. PATENT DOCUMENTS

| | | | | | |
|---|---|---|---|---|---|
| 5,394,503 | A * | 2/1995 | Dietz, Jr. | ............ | G02B 6/3895 385/139 |
| 5,854,824 | A * | 12/1998 | Bengal | ................... | H04Q 1/136 379/22 |
| 6,750,643 | B2 | 6/2004 | Hwang et al. | | |
| 6,961,675 | B2 * | 11/2005 | David | ..................... | H04L 43/00 702/183 |
| 7,153,142 | B2 * | 12/2006 | Shifris | ................ | H04L 43/0811 700/200 |
| 8,197,280 | B2 | 6/2012 | Caveney et al. | | |
| 9,176,923 | B2 * | 11/2015 | Bower, III | ............ | G06F 15/161 |
| 10,826,780 | B1 * | 11/2020 | Ivarson | ................... | H04L 41/34 |
| 2004/0000898 | A1 * | 1/2004 | Pool | ....................... | G01R 31/60 324/66 |
| 2009/0282283 | A1 * | 11/2009 | Sakakura | ............ | G06F 11/2033 709/224 |
| 2010/0266117 | A1 * | 10/2010 | Enge | ...................... | H04Q 1/136 379/397 |

(Continued)

FOREIGN PATENT DOCUMENTS

WO    2021067241 A1    4/2021

OTHER PUBLICATIONS

The Siemon Company Corporation, "MapIT(R) G2 Next Generation Automatied Infrastructure Management Powered by: Eagle Eye Connect", 16 pages, May 2019.

(Continued)

*Primary Examiner* — Nay Tun
(74) *Attorney, Agent, or Firm* — Hooker & Habib, P.C.

(57) ABSTRACT

A distribution system that includes central ports connected by lines to respective remote ports includes a visual identification system that enables either identifying the central ports connected with selected remote ports, or identifying the remote ports connected with selected central ports. The visual identification system includes signal paths extending between the central and remote ports. The signal paths are connected to output devices that generate visual, auditory, or tactile feedback to identify the ports. The signal paths operate independently of the lines connecting the ports.

21 Claims, 6 Drawing Sheets

(56) References Cited

U.S. PATENT DOCUMENTS

| | | | |
|---|---|---|---|
| 2011/0189886 A1* | 8/2011 | Chen | H04Q 1/13 |
| | | | 439/488 |
| 2012/0187961 A1 | 7/2012 | Hashim et al. | |
| 2016/0099749 A1 | 4/2016 | Bennett et al. | |
| 2018/0200552 A1 | 7/2018 | Wertsberger | |

OTHER PUBLICATIONS

United States Patent and Trademark Office, International Search Report in corresponding PCT/US23/19908, dated Jul. 21, 2023, 11 pages.

* cited by examiner

PORT-TO-PORT VISUAL IDENTIFICATION SYSTEM

RELATED APPLICATION

This application claims priority to and the benefit of U.S. Provisional Patent Application Ser. No. 63/183,257 "Visual identification of work area faceplate and faceplate components" filed May 3, 2021 and on the filing date of this patent application, which priority application is incorporated by reference as if fully set forth herein.

FIELD OF THE DISCLOSURE

The disclosure relates generally to identifying central ports connected to or associated with remote ports used in distributed systems such as electrical distribution systems or telecommunication networks of homes, offices, or industrial plants.

BACKGROUND OF THE DISCLOSURE

Electrical distribution systems, telecommunication networks, and the like used in homes, offices, and industrial plants often include a central location that connects the home, office, or plant to external sources. The electrical power or telecommunications are transmitted through the central location and are transmitted via power lines or telecommunications cabling to remote locations throughout the home, office, or plant.

Electrical distribution systems, for example, typically receive electrical power into a central breaker box or electrical panel. The electrical power is then distributed by separate electrical circuits extending from central ports formed as circuit breakers in the breaker box to respective sets of remote ports realized as electrical receptacles remote from the breaker box. The electrical receptacle installations are surrounded by faceplates that attach to a wall or other surface.

Telecommunications systems, as another example, may receive telephone and internet connections into a central distribution block or patch panel. Telecommunications cabling, including for example, Ethernet cables, optical cables, telephone lines, and the like, extend from ports formed as telecommunications sockets in the patch panel to remote ports formed as telecommunication sockets (such as, for a non-limiting example, RJ45 Ethernet jacks) located in rooms or workstations away from the patch panel. The telecommunications sockets in a room or workstation may be attached to and surrounded by a faceplate that secures the ports to a wall or other surface of the room or workstation.

There is often a need to accurately identify which central port (for example, a circuit breaker or patch panel jack) is connected to a remote port (for example, an electrical receptacle or remote jack). A common way of associating remote ports with their associated central ports is through use of paper labels in conjunction with a naming or identification scheme. Paper label identifiers are attached to or near the breaker box circuit breakers or patch panel jacks and sockets and corresponding paper labels are attached to or near the faceplates.

But use of label identifier schemes poses a number of problems.

During the installation process throughout the life cycle of the components there exists a high probability of errors and omissions that comprises the accuracy of identification. Labels may not be attached or may be lost or become damaged. Labels may not correctly associate the faceplate with the proper remote component (s). Labels may be placed upside down (a 6 becomes a 9). Labels may be illegible or fade over time. The label may be difficult to see or read. Duplicate labels may be inadvertently created and used.

Furthermore, label identifiers are typically used on a per port basis at the central location to map the port to a remote port, making the label identifier scheme labor intensive. Label identifier schemes can be expensive to administer over the life of the components and difficult to adapt to infrastructure changes.

As an alternative to physical labeling schemes, the cabling or wiring connecting a central port and a remote port can itself be used to communicate electronic labeling information relating the two ports. Examples of such virtual labeling schemes include data center infrastructure management (for example, utilizing EAGLEEYE® software sold by The Siemon Company Corporation, Watertown CT), the group wiring patching device disclosed in Hwang et al. U.S. Pat. No. 6,750,643, and patch cords that include LEDs on each end of the cord that can be energized to identify the ends of the cord. But these solutions are also on a per-port basis and are relatively expensive.

Thus there is a need for a new method of remote-local component identification that overcomes the shortcomings of currently used physical and virtual identifier schemes.

SUMMARY OF THE DISCLOSURE

Disclosed is a method and related system for identifying central ports associated with or connected to remote ports of a distributed system.

A first embodiment of a method for identifying a central port associated with a remote port in accordance with this disclosure takes advantage of the use of a faceplate with the remote port. As used herein, the term "faceplate" is also used generically (unless the context implies otherwise) for a faceplate, wall panel, panel, frame, bracket, electrical box, or other container or structure that is used to surround, contain, hold, or otherwise define or associate the position or location of a set of one or more remote ports with respect to one or more central ports.

A separate signal path extends from the faceplate to the location of the central ports associated with the set of remote ports of the faceplate. Injecting a signal into the signal path generates a visual, auditory, or tactile output signal at the location of the central ports that associates the one or more remote ports of the faceplate with the associated central ports at the central location.

An example of the first method applied for locating the central circuit breaker connected to a remote electrical receptacle includes the step of injecting a signal into a signal path extending from a first end point at the faceplate surrounding the receptacle to a second end point in a breaker box holding the circuit breaker that is closely adjacent to the circuit breaker. The output signal is thereby generated closely adjacent to the circuit breaker, identifying that circuit breaker as the one connected to the receptacle.

A second example of the first method applied for locating the central sockets connected to a remote set of a sockets includes the step of injecting a signal into a signal path extending from the faceplate surrounding the remote set of sockets to an end point on the outside of the patch panel holding the central sockets, the end point being closely adjacent to the central sockets. The output signal is thereby generated closely adjacent to the central sockets connected to the remote sockets, identifying those central sockets as those connected to the remote sockets.

In the second example, the patch panel is organized to enable easy recognition of the central sockets identified by the output signal. The central sockets connected to the set of remote sockets held by the faceplate are arranged in the patch panel to be set close together and/or adjacent to one another. Colors or markings applied to the patch panel, patch panel plate orientations, ordering of the sockets, and the like can also be used to allow quick and reliable identification of the sockets associated with the output signal.

The signal path extending from a faceplate in accordance with this disclosure can be formed in a first embodiment as a normally-open electrical circuit having a female 2.5 mm micro-jack mounted in the faceplate at the first end and an LED at the second end. An actuator having a battery connected to a male 2.5 mm micro-jack is inserted into the faceplate jack to close the circuit and inject electrical current energizing the LED.

Other types of electrical connectors can be used to open and close the signal path and inject a signal into the signal path.

In non-limiting alternative embodiments of the signal path, the output signal can be generated by a different light generator such as a strobe, by an audio generator such as a buzzer or horn, by a vibrating device, or can be generated by actuating an external device such as a computer that generates an action based on the existence of the signal. The injected signal can open or close a relay that causes the output signal to be generated.

In non-limiting alternative embodiments of the signal path, the faceplate can carry a battery or be connected to an external power supply. The signal can be injected into the signal path by pressing a button or other actuator mounted on the faceplate, be generated in response to a wireless signal generated by a smartphone or the like, or generated in response to spoken commands.

A second embodiment of the disclosed method is similar to the first embodiment method but has the signal path extending from a first end point adjacent to the faceplate and not from the faceplate itself. This enables conventional, currently available faceplates to still be used with the disclosed identification system.

A signal path may also be connected as input to a monitoring system that monitors actuation of any of the signal paths of the disclosed identification system. The monitoring system can take initiate action based on the signal paths being energized, the locations of the faceplates associated with the energized signal paths, and the like.

In alternative embodiments of the disclosed identification system, signal paths extend from the central ports to the remote ports. Signals are injected into signal paths at the central ports to identify the remote ports connected to the central ports.

In yet additional alternative embodiments of the disclose identification system, a first set of signal paths extend from the remote ports to the central ports and a second set of signal paths extend from the central ports to the remote ports. Signals are injected into the first set signal paths at the remote ports to identify the central ports connected to the remote ports. Signals are injected into the second set of signal paths at the central ports to identify the remote ports connected to the central ports.

The disclosed method and related system for identifying separated central ports associated with or connected to remote ports of a distributed system has a number of advantages.

The use of paper labels and labeling schemes can be eliminated.

The signal paths are defined independently of the connections between the central ports and the remote ports and so do not affect performance of the ports and connections between the ports. Essentially any type of port, including future port types, can be used with the disclosed method and system, and enables port types and connector types to be independently changed, replaced, or updated without affecting performance of the disclosed method and system.

The signal paths of the disclosed method and system do not use conductors extending between the central ports and the remote ports and so does not impact performance of the central ports, remote ports, or the connections between ports. A failure of a port or a connection between ports does not affect performance of the disclosed method and system.

The disclosed method and system enables a signal path to be associated with faceplates holding a set of multiple remote ports. By being associated with multiple ports, the complexity and cost of the disclosed method and system is reduced.

Other objects and features of the disclosure will become apparent as the description proceeds, especially when taken in conjunction with the accompanying drawing sheets illustrating one or more illustrative embodiments.

DETAILED DESCRIPTION

Figure 1:
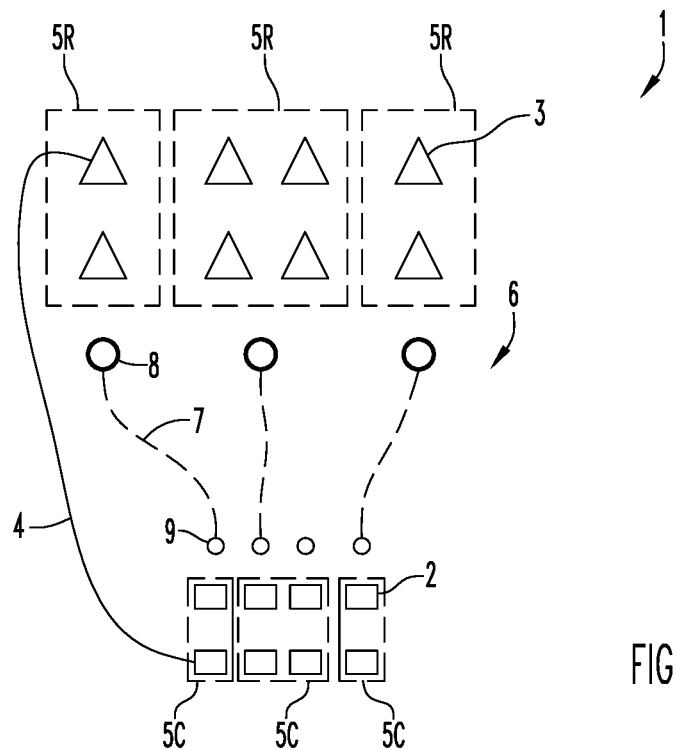
FIG. 1 schematically illustrates a distribution system that includes a first embodiment identification system to identify the sets of central ports connected to respective sets of remote ports.
Figure 2:
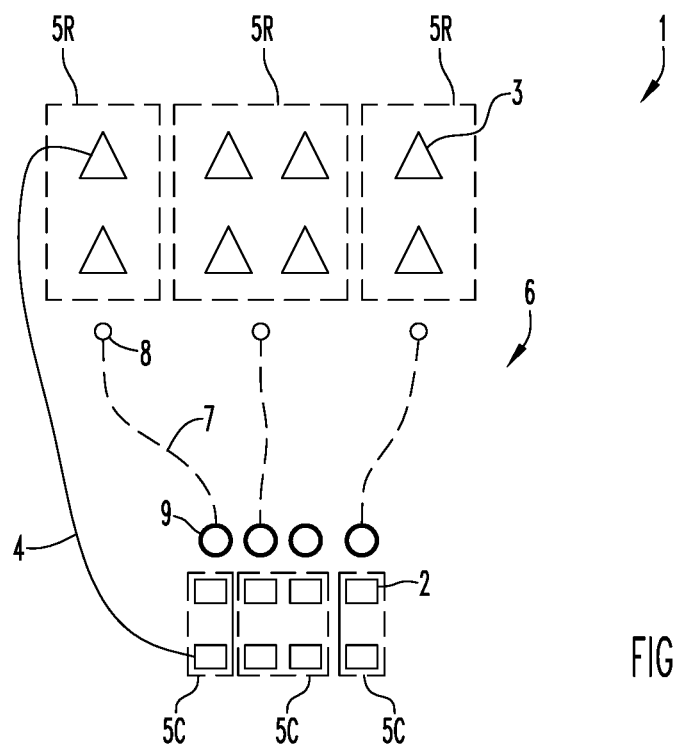
FIG. 2 schematically illustrates the distribution system of FIG. 1 that includes a second embodiment identification system to identify the sets of remote ports connected to respective sets of central ports.

FIGS. 1 and 2 each schematically illustrates a generic distribution system 1 for distributing electrical or fluid communications from a central location to a number of remote locations. The distribution system includes a number of central ports 2 (drawn as rectangles) being disposed at a central location and a number of remote ports 3 (drawn as triangles) being disposed at remote locations spaced away from the central location.

Each central port 2 is connected to a respective remote port 3 by a respective transmission line 4 that is configured for electrical or fluid communication between the central port 2 and the remote port 3 through the transmission line 4. To simplify the drawings, FIGS. 1 and 2 illustrate only one transmission line 4.

The central ports 2 define sets 5C of one or more central ports 2. Each set 5C of central ports is connected to a respective set 5R of the remote ports 3. Each set 5R of remote ports 3 is located at a respective remote location that is different from the remote locations of the other sets 5R of the remote ports 3.

Each distribution system 1 further includes an identification system 6 in accordance with this disclosure. The identification system 6 includes a number of individual signal paths 7 (shown n in dashed lines to distinguish from the transmission lines 4) that are separate from the transmission lines 4. Each signal path 7 is capable of having a signal injected into and transmitted along the signal path. A signal path may be formed as electrical conductors, a fluid hose, or other physical signal line. A signal injected into a signal path 7 may be an electric voltage or current, a fluid pressure or fluid flow, or the like that changes the state of the signal path (for example, by causing the signal line to transmit electric current, to hold increased internal fluid pressure, or the like).

Each signal path 7 extends between and operatively connects a respective signal receiver 8 and an output device 9 disposed at respective first and second end portions of the signal path. Each signal receiver 8 may be formed as a set of electrical contacts or terminal that enable a voltage to be applied to the signal path, a hose fitting that enables fluid pressure to be applied to the signal path, or the like to enable the state of the signal line to be selectively changed. Each output device 9 is configured to generate a visual, auditory, or tactile output signal when a signal is injected into the connected signal path.

Each signal path 7 is associated with a respective set 5C of central ports 2 and the set 5R of remote ports 3 connected to the respective set 5C. The association between signal path and connected sets 5C and 5R of central and remote ports is made by disposing the signal receiver and output device in physical association with respective connected sets 5C and 5R of central ports and remote ports.

In FIG. 1, each signal receiver 8 connected to a signal path is disposed to be physically associated with a respective set 5R of remote ports 4 and the output device 9 connected to the signal path is disposed to be physically associated with the set 5C of central ports 3 connected to the set 5R. Injecting a signal into the signal path at the signal receiver 9 associated with a set 5R of remote ports actuates the output device 9 and thereby identifies the set 5C of central ports connected to the set 5R of remote ports.

In FIG. 2, each signal receiver 8 connected to a signal path is disposed to be physically associated with a respective set 5C of central ports and the output device 9 connected to the signal path is disposed to be physically associated with the set 5R of remote ports connected to the set 5C. Injecting a signal into the signal path at the signal receiver 9 associated with a set 5C of central ports actuates the output device 9 and thereby identifies the set 5R of remote ports connected to the set 5C of remote ports.

In yet other embodiments of the distribution system 1, the distribution system has an identification system that includes both signal paths as configured in FIG. 1 and signal paths as configured in FIG. 2.

Additional examples of distribution systems that include an identification system in accordance with this disclosure are provided next.

Figure 3:
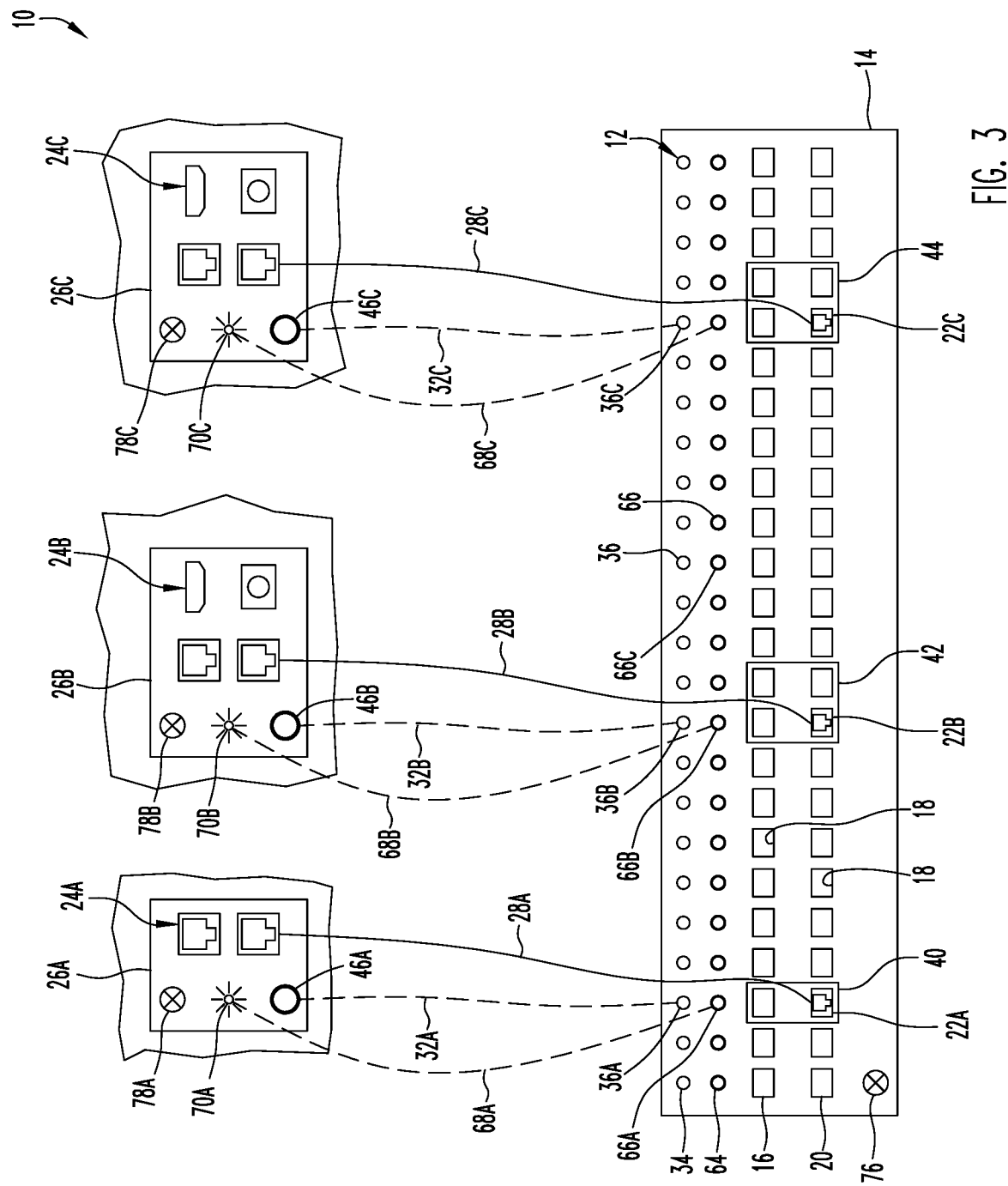
FIG. 3 illustrates a first embodiment telecommunications system utilizing the disclosed identification system to identify sets of remote telecommunication ports and their associated sets of central telecommunication ports.

FIG. 3 illustrates part of an office telecommunications network 10 utilizing an identification system 12 in accordance with this disclosure to identify sets of remote telecommunication ports and their associated sets of central telecommunications ports.

The telecommunications system 10 includes a patch panel 14, the front of the patch panel shown in the figure. The patch panel 14 interconnects multiple computers and printers distributed throughout the office to an external network for web access, email, and the like.

The illustrated patch panel 14 is a 48-port patch panel having a first row 16 of twenty-four horizontally spaced upper knockouts 18 and a second row 20 of twenty-four horizontally spaced lower knockouts 18. Pairs of upper and lower knockouts are vertically aligned with one another as shown in FIG. 3. Each knockout 18 holds a telecommunications port 22 such as (but not limited to) an Ethernet RJ-45 port (to simplify the drawing, the patch panel 14 is shown with three ports 22).

Telecommunications cabling extends away from the patch panel 14 from each of the central patch panel ports 22. The communications cabling extends on a per-port arrangement to corresponding sets of remote ports 24 located throughout the office. The remote ports include a first set 24A of two ports in a first room or cubicle, a second set 24B of four ports in a second room or cubicle, and a third set 24C of four ports in a third room or cubicle. Each set of ports 24 is contained in a respective faceplate 26 (see the two-port faceplate 26A and four port faceplates 26B and 328C containing respectively port set 24A, port set 24B, and port set 24C) attached to the room or cubicle wall.

FIG. 3 illustrates the telecommunications cabling including, in the illustrated embodiment, Ethernet cables 28 connected to and extending from respective patch panel ports 22 to a remote Ethernet port of each of the remote port sets 24A, 24B, and 24C. To simplify the drawing, other telecommunications cabling from the patch panel to the remote port sets is omitted from FIG. 3.

The identification system 12 enables a technician to identify which ports 22 of the patch panel 14 are associated with (connected to) the respective remote port 24 distributed throughout the office.

A separate signal path 32 extends from each faceplate 26 to the patch panel 14 (to distinguish signal paths 32 from cabling 28, signal paths 32 are shown in dashed lines in the figures). As described in more detail below, injecting a signal into a signal path 32 generates an output signal at the patch panel 14 identifying the patch panel ports 22 that are connected to the set 24 of remote ports associate with the signal path. The illustrated signal paths 32A, 32B, and 32C extend respectively from the faceplates 26A, 26B, and 26C to the patch panel 14.

The illustrated identification system 12 uses LEDs forming part of the signal paths 32 to generate a visual output signal when a signal is injected into a signal path. The patch panel 14 includes a row 34 of twenty-four horizontally spaced LEDs 36 vertically aligned with the knockouts 18 as shown in FIG. 3. Each LED 36 is vertically aligned with a respective pair of upper and lower knockouts 18. The LEDs 36 are mounted on a common printed circuit board 38 (see FIG. 4) mounted on a rear side of the patch panel 14. The printed circuit board 38 includes conventional circuitry that enables each LED to be attached to the circuit board without regard to the polarity of the LED.

The patch panel ports 22 are arranged so that central ports 22 connected to the same set of remote ports 24 are located together in the same area of the patch panel. In FIG. 3, the two ports 22 connected to the remote port set 24A are vertically aligned with each other and contained within the rectangle 40. The four ports 22 connected to the four ports of the remote port set 24b are arranged as vertically aligned adjacent pairs of ports contained within the rectangle 42. Similarly the four ports 22 connected to remote port set 24C are contained within the rectangle 44.

Figure 4:
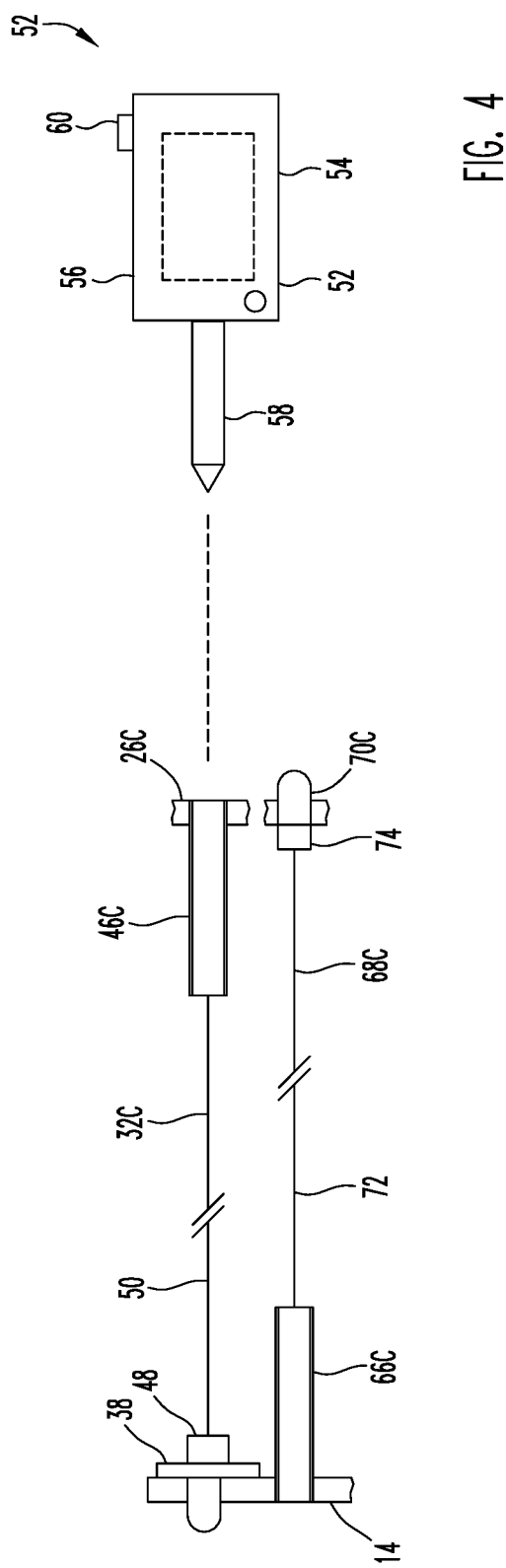
FIG. 4 is a schematic view of the signal connections used between a set of central ports and the associate remote ports of the telecommunications system of FIG. 1.

FIG. 4 illustrates as a representative signal path the signal path 32C extending from the faceplate 26C to the patch panel 14. The signal path 32C is formed as an electrical circuit extending from a signal receiver 46 formed as a tubular female electrical mini-jack 46 mounted in the faceplate 26C to the output device formed as the LED 36C on the patch panel 14. An electrical receptacle 48 on the PCB 38 is disposed in series with the LED 36 and receives a two-wire conductor 50 connected in series with the faceplate mini-jack 46. Other types of multi-wire conductors, optical fiber conductors may be used to form the signal path.

A signal is injected into the signal path 32C using a hand-held probe or signal injector 52. The signal injector includes a battery 54 disposed inside a case 56. A male mini-jack 58 compatible with the faceplate mini-jack 46 extends from the case and is selectively connected to the battery by pressing a pushbutton 60. An LED 62 mounted on the case is connected in series between the battery 54 and the mini-jack 58.

In other embodiments of a signal path, a battery is connected in series in the signal path and applies a voltage when the signal path is closed. The signal injector merely closes the circuit and does not provide power to the circuit.

When a technician inserts the signal injector mini-jack 58 into the faceplate mini-jack 46 and the button 60 is pressed, the signal path 32C becomes a closed electrical circuit extending from the battery 54 to the LED 36C. A signal is injected into the signal path 32C by the battery applying voltage to the signal path 32C and generating electrical current energizing and illuminating the LED 36C at the patch panel 14. The LED 36C can be selected to output a desired color and intensity light output and may be configured to pulse or blink when energized.

The signal injector LED 62 is also energized and illuminates, indicating electrical continuity along the signal path 32C and assuring the technician that the patch panel LED 36C is illuminated.

A technician at the patch panel 14 sees the LED 36C being illuminated. Knowing that the faceplate 24C is a four-port faceplate, the patch panel LED 36C identifies to the technician that the four ports 22 contained within the rectangle 44 are the four patch panel ports 22 connected to the set of four faceplate ports 24C. By installing the four patch panel ports 22 in the same arrangement as the four faceplate ports 24C, the technician can identify which respective patch panel port 22 contained within the rectangle 44 is connected to which respective faceplate port contained within the faceplate 26C.

As shown in FIG. 3, a single signal path 32 extends from a faceplate 26 to a patch panel LED 36. Experience in developing the disclosed identification system 12 has found that using a single LED to identify a set of ports associated with a remote faceplate works well in practice, and minimizes installation costs because a one-to-one port-to-LED correspondence is not required.

The illustrated identification system 12 also includes an optional, separate identification subsystem that identifies which faceplate 26 is associated with respective sets of patch panel ports 22. The patch panel 14 includes a horizontal row 64 of spaced-apart female mini-jacks 66 (like the mini-jacks 46) accessible from the front of the patch panel 14. The mini-jacks 66 are below and vertically aligned with the patch panel LEDs 36 as seen in FIG. 3.

Signal paths 68 extend from the patch panel 14 to the faceplates 26. Each signal path 68 is similar to a signal path 32 but extends from the a patch panel mini-jack 66 to an LED 70 mounted in a faceplate 26 (see signal path 68A extending from mini-jack 66A to LED 70A, signal path 68B extending from mini-jack 66B to LED 70B, and signal path 68C extending from mini-jack 66C to LED 70B).

A representative signal path 68C is shown in FIG. 4. A two-wire conductor 72 like the conductor 50 connects the mini-jack 66C and faceplate LED 70C. The LED 70C includes circuitry 74 that enables operation of the LED regardless of the polarity of the connection of the LED with respect to the signal path.

A technician desiring to know which faceplate 26 is associated with a patch panel port 22 plugs the signal injector 52 into the mini-jack 66 associated with the port 22. A signal path 68 extends from the mini-jack 66 located vertically below the LED 36 associated with the signal path 32 extending from the faceplate containing the remote port 24 connected to the patch panel port 22, enabling the technician to readily identify which mini-jack 66 to insert the signal injector 52.

Experience developing the disclosed identification system 12 has also found that using a single mini-jack 66 to identify which faceplate is associated with a remote faceplate works well in practice, and minimizes installation costs.

The identification system 12 further includes an audio speaker 76 (see FIG. 3) disposed in the patch panel 14 and an audio speaker 78 in each faceplate 26.

The patch panel audio speaker 76 is connected to the PCB 38 and is configured to issue an audio alert when an LED 36 is energized. The audio alert is intended to inform technicians in the vicinity of the patch panel 14 that an LED 36 has been energized. The use of the audio speaker being activated in response to signal injection is an example that signal injection can be used to initiate other actions in addition to visual identification.

Each faceplate audio speaker 78 is electrically connected in series with the faceplate LED 70 and is configured to issue an audio alert when the faceplate LED 70 is energized. The audio alert is intended to inform technicians that the faceplate LED 70 has been energized and can be useful in identifying the location of the faceplate 26 within the office.

Figure 5:
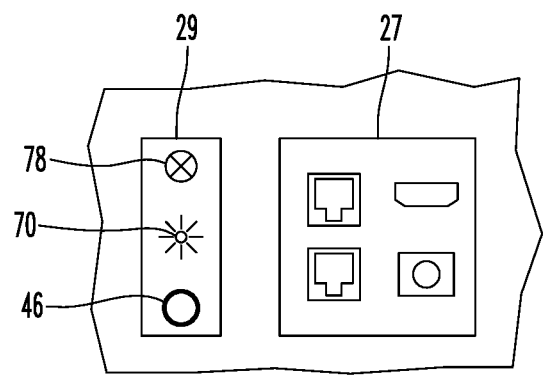
FIG. 5 illustrates part of a second embodiment telecommunications system similar to the system shown in FIG. 3 but with socket faceplates that contain only telecommunications sockets.
Figure 6:
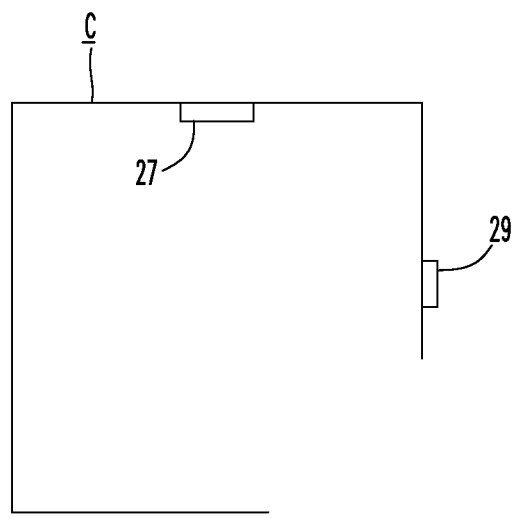
FIG. 6 illustrates part of a third embodiment telecommunications system similar to the shown in FIG. 5 but the signal paths being associated to the sets of remote sockets by being associated with respective cubicles or rooms of an office.

In FIG. 3, a faceplate mini-jack 46, LED 70, and audio speaker 78 are associated with a remote port set 24 by being mounted in the same faceplate 26 that also mounts the port set 24. FIGS. 5 and 6 illustrate non-limiting examples of other ways components of the identification system 12 can be associated with a remote port set 24.

FIG. 5 illustrates use of the identification system 12 but with a conventional faceplate 27 that mounts only the port set 24. The mini-jack 46, LED 70, and speaker 78 are mounted in a separate faceplate 29 designed to hold only those components. The identification system components held by the faceplate 29 are associated with the port set 24 by the close proximity of the faceplate 29 to the faceplate 27.

FIG. 6 illustrates the footprint of an office cubicle C in which a faceplate 27 and faceplate 29 like those shown in FIG. 5 are used by the identification system 12. The faceplate 27 (and its associated port set, not shown) are attached to an inside wall of the cubicle. The faceplate 29 (and its associated identification components, not shown) are attached to an external wall of the cubicle. The identification system components held by the faceplate 29 are associated with the port set 24 by the faceplates 27, 29 being attached to the same cubicle.

Figure 7:
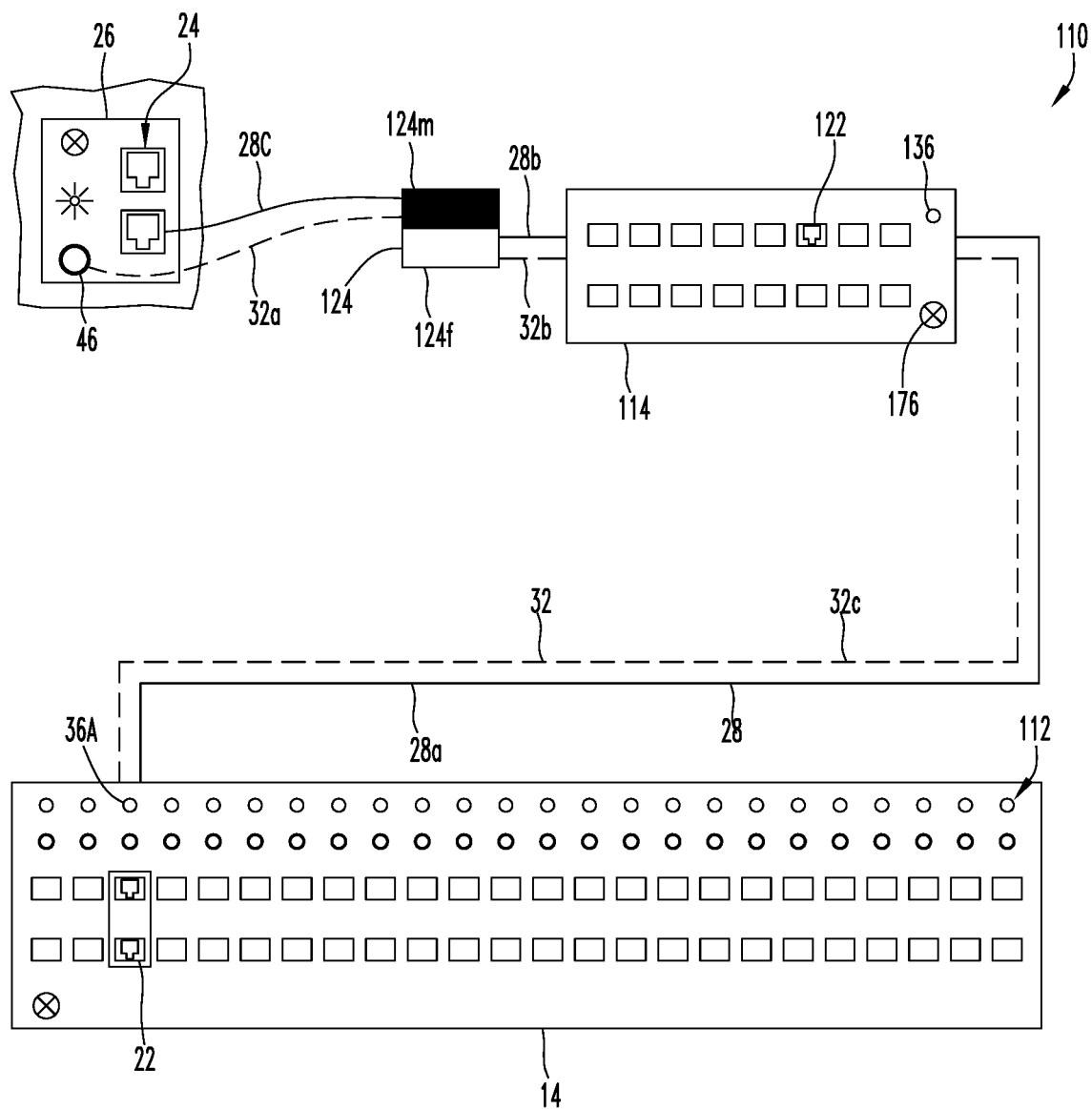
FIG. 7 illustrates part of a fourth embodiment telecommunications system similar to the system shown in FIG. 1 but with the central telecommunications sockets in the patch panel connected to the remote central telecommunications sockets through an intermediate patch panel.

FIG. 7 illustrates use of a second embodiment identification system 112 with a second embodiment telecommunications system 110. The same reference numbers are used in describing elements of the second embodiment systems 110, 112 corresponding to like or similar elements of the first embodiment systems 10, 12. Only differences are discussed.

The telecommunications system 110 utilizes a segmented cabling arrangement. The ports 22 of the patch panel 14 are connected to respective remote ports 24 contained in the faceplate 26 through a subpanel or intermediate patch panel 114.

Telecommunication lines 28 extend from respective patch panel ports 22 of the patch panel 14 to the remote ports 24. For clarity, only a single telecommunications line 28 is shown in the figure. Each telecommunication line 28 includes a home run cable 28a extending from a respective patch panel port 22 to a respective port 122 of the intermediate patch panel 114, an intermediate cable 28b extending from the port 122 to a cable connector 124, and a cable 28c extending from the cable connector 124 to the remote port 24.

The cable connector 124 has mating male and female electrical connectors 124m, 124f that electrically interconnect the cables 28c and 28b extending between the remote ports 24 and the intermediate patch panel 114.

Signal lines 32 extend from each respective remote port 24 to a respective patch panel port 22 of the patch panel 14. For clarity, only a single signal line 32 is shown in FIG. 7. Each signal line 32 includes a home run signal line 32a extending from the faceplate mini-jack 46 to the cable connector 124, an intermediate signal line 32b extending from the cable connector 124 to the intermediate patch panel 114, and an end signal line 32c extending from the intermediate patch panel 114 to the patch panel LED 36 associated with the remote ports 24.

In the illustrated embodiment the cable connector 124 connects all communication line segments 28c and connects all signal line segments 32a to respective communication line segments 28b and signal line segments 32a extending from the intermediate patch panel 114.

The intermediate patch panel 114 includes a display LED 136 and a speaker 176. The LED 136 is connected to energize whenever a signal is injected into a signal line 32. The audio speaker 176 generates an audio alert whenever a signal is injected into a signal line 32 extending through the intermediate patch panel 114.

A signal is injected into the signal line 32 by inserting the mini-jack of the signal injector 52 into the mini-jack 46. The signal energizes the LED 36A in the patch panel 14 to identify the ports 22 of the patch panel associated with the signal as described previously with respect to FIG. 3.

The illustrated identification system 112 also includes the separate identification subsystem that includes signal paths extending from mini-jacks mounted in the patch panel 14 that extend to LEDs mounted in the remote faceplates as previously described with respect to the identification system 12.

Embodiments of the disclosed identification system can be used to identify ports other than telecommunication ports.

Figure 8:
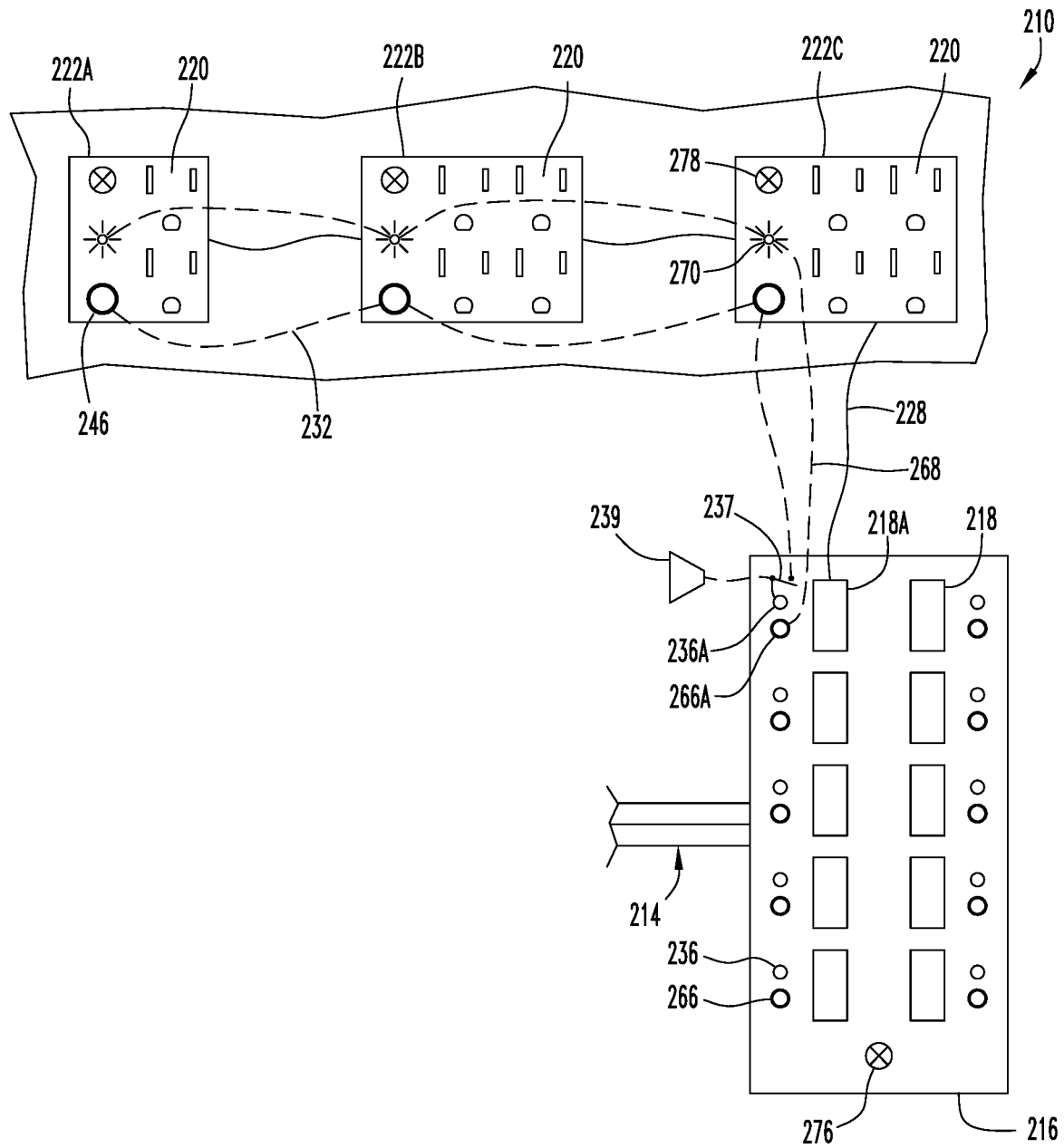
FIG. 8 illustrates a residential electrical distribution system utilizing the disclosed identification system to identify the circuit breakers contained in a breaker box that are connected to different sets of remote electrical outlets.

FIG. 8 illustrates a residential electrical system 210 having an identification system 212 in accordance with this disclosure that identifies circuit breakers connected to electrical outlets of the residence.

The electrical system 210 receives power through external power lines 214 that is received into a central panel box or electrical breaker box 216. Mounted in the breaker box are ten circuit breakers 218. Circuit breaker 218A of the circuit breakers 218 distributes power to remote electrical ports realized as electrical sockets 220. The other circuit breakers distribute power to other remote electrical ports (not shown).

The electrical sockets 220 are contained in a two-outlet faceplate 222A, a four-outlet faceplate 222B, and a four-outlet faceplate 222C. The electrical sockets 220 illustrated in FIG. 8 are NEMA 5-15 electrical sockets commonly used in the United States with 110V, 60 Hz electrical service.

Electrical lines extend from the circuit breakers to the electrical sockets. For clarity, only a single electrical line 228 is shown extending from the circuit breaker 218A to the electrical sockets 220 located in a different part of the residence away from the breaker box 216. The wiring of the circuit breakers and electrical sockets is conventional residential electrical wiring and so will not be described in further detail.

The identification system 212 includes a set of ten LEDs 236 mounted in the breaker box 218. Each LED 236 is located closely adjacent to a respective circuit breaker 218 to associate that LED 236 with the adjacent circuit breaker. The LEDs may be mounted on a printed circuit board or circuit boards (not shown) similar to the printed circuit board 38 to simplify LED wiring and installation.

The identification system 212 further includes a female mini-jack 246 in each faceplate 222. The mini-jacks 246 are connected in parallel to form part of a signal line 232 extending between pairs of mini-jacks 246 and to the breaker box 218. The signal line terminates at an LED 236A adjacent to the circuit box 218A that is electrically connected to the electrical sockets 220 contained in the faceplates 222 holding the mini-jacks 246.

A signal is injected into the signal line 232 by inserting the male mini-jack of the signal injector 52 (see FIG. 4) into a mini-jack 246 as previously described for a signal line 32. The LED 236A of the signal line illuminates and identifies the circuit breaker 218A connected to the electrical sockets associated with the mini-jack 246.

The identification system 212 also includes a speaker 276 mounted in the breaker box 218. The speaker 276 emits an audible alert whenever an LED 236 is illuminated.

The illustrated identification system 212 further places a normally-open relay in each signal line that closes when a signal is injected into the signal line. FIG. 8 illustrates a relay 237 in the signal line 232. The relay 237 closes when a signal is injected into the signal line 232. In the illustrated embodiment each relay is connected to a common external speaker 239. When any relay closes, the speaker 239 emits an audio alert away from the breaker box 218 indicating that an LED 236 has been energized.

The illustrated identification system 212 also includes an optional, separate identification subsystem. The subsystem identifies which electrical socket faceplates are associated with a circuit breaker. The subsystem includes a set of female mini-jacks 266 (like the mini-jacks 246) mounted in the breaker box 218. Each female mini-jack 266 is located closely adjacent to a respective circuit breaker 218 to associate that jack 246 with the adjacent circuit breaker.

Signal lines extend from each respective female mini-jack to LEDs located in the faceplates surrounding the electrical sockets connected to the circuit breaker adjacent the mini-jack.

FIG. 8 illustrates a signal line 268 extending from the breaker box mini-jack 266A adjacent to the circuit breaker 218A. The signal line 268 includes and extends to LEDs 270 mounted in the faceplates 222. The LEDs 270 are wired in series in the signal line 268. When a signal is injected into the signal line 268, the LEDs 270 are simultaneously illuminated to identify all the electrical sockets 220 connected to the circuit breaker 218A.

Each faceplate 222 also includes an audio speaker 278 that emits an audio signal while a signal is injected into the signal line 230.

Another non-limiting example of a system that can employ the disclosed visual identification system includes an irrigation system that receives water into a central manifold. The irrigation system distributes water for irrigation from distribution ports of the manifold connected to hoses that extend to remote discharge ports. The disclosed identification system can be used to identify the discharge port(s) connected to a distribution port or to identify the distribution port connected to a discharge port or discharge ports.

While this disclosure includes one or more illustrative embodiments described in detail, it is understood that the one or more embodiments are each capable of modification and that the scope of this disclosure is not limited to the precise details set forth herein but include such modifications that would be obvious to a person of ordinary skill in the relevant including (but not limited to) changes in material selection, signal circuit electrical design, visual, audio, and other output devices, environment of use, and the like, as well as such changes and alterations that fall within the purview of the following claims.

What is claimed is:

1. A distribution system for distributing electrical or fluid communications from a central location to a number of remote locations, the distribution system comprising:
  a plurality of central ports;
  a plurality of remote ports remote from and spaced away from the plurality of central ports;
  each central port being connected to a respective remote port by a transmission line for electrical or fluid communication between the central port and the remote port through the transmission line;
  the plurality of central ports defining a plurality of sets of central ports, each set of central ports being connected to a respective set of remote ports by the transmission lines extending between the central ports of the set of central ports and the remote ports of the set of remote parts;
  an identification system comprising a plurality of signal paths, a plurality of signal receivers, and a plurality of output devices, each signal path of the plurality of signal paths being physically separated from and not being attached to the transmission lines connecting the central ports and the remote ports, each signal path of the plurality of signal paths being physically separated from and not being attached to both the plurality of remote ports and the plurality of central ports;
  each signal path being connected to and extending between a respective signal receiver disposed at one end of the signal path and a respective output device disposed at an opposite end of the signal path from the first end, the signal receiver being configured to inject a signal into the signal path, the output device being configured to generate a visual, auditory, or tactile output signal when a signal is injected into the signal path; and
  each signal receiver being disposed at a physical location associated with a respective set of central ports or each signal receiver being disposed at a physical location associated with a respective set of remote ports, and the output device connected to the signal receiver being disposed at a physical location associated with the other of the set of central ports or the set of remote ports connected to the respective set of central ports or respective remote ports associated with the signal receiver whereby each signal path is associated with a respective connected set of central ports and set of remote ports.

2. The distribution system of claim 1 wherein each signal receiver is disposed at a physical location associated with a respective set of remote ports and the output device connected to the signal receiver is disposed at a physical location associated with the set of central ports connected to the respective set of remote ports.

3. The distribution system of claim 1 wherein at least one signal line plurality of signal receivers operatively connected in parallel to the at least one signal line whereby injecting a signal into any one of the plurality of signal receivers causes the output device connected to the at least one signal line to generate an output signal.

4. The distribution system of claim 1 wherein each signal receiver is disposed at a physical location associated with a respective set of central ports and the output device connected to the signal receiver is disposed at a physical location associated with the set of remote ports connected to the respective set of central ports.

5. The distribution system of claim 1 wherein each signal path comprises a normally open electrical circuit, the signal receiver connected to the signal path being an electrical contact electrically connected to the electrical circuit and the output device connected to the signal path being electrically connected to the electrical circuit.

6. The distribution system of claim 5 wherein each output device comprises an LED and/or an audio speaker.

7. The distribution system of claim 6 wherein the LEDs of the output devices are mounted on a common printed circuit board.

8. The distribution system of claim 5 wherein the identification system comprises at least one battery selectively electrically connectable to the electrical contact of each signal receiver to apply a voltage to the signal path connected to the signal receiver.

9. The distribution system of claim 1 wherein the plurality of signal paths is connected in to a common audio speaker whereby the common audio speaker is energized when a signal is injected into any one of the plurality of signal paths.

10. The distribution system of claim 1 wherein the distribution system is a telecommunications distribution system, each central port and each remote port being a telecommunications socket, each transmission line being configured to carry a telecommunications signal.

11. The distribution system of claim 10 wherein the plurality of central ports is disposed in a patch panel.

12. The distribution system of claim 11 wherein the plurality of signal receivers or the plurality of output devices associated with the sets of central ports are disposed in the patch panel.

13. The distribution system of claim 12 wherein the patch panel is configured to arrange the plurality of central ports as a plurality of rows and a plurality of columns, each of the plurality of signal receivers or the plurality of output devices associated with the sets of central ports being aligned with a respective column.

14. The distribution system of claim 13 wherein the plurality of output devices is associated with the sets of central ports.

15. The distribution system of claim 10 wherein the plurality of signal receivers is associated with the sets of remote ports, each set of remote ports being contained within a respective faceplate.

16. The distribution system of claim 15 wherein the plurality of signal paths, the plurality of signal receivers, and the plurality of output devices are a first plurality of signal paths, a first plurality of signal receivers, and a first plurality of output devices respectively;
  the distribution system comprises a second plurality of signal paths, a second plurality of signal receivers, and a second plurality of output devices, each signal path of the second plurality of signal paths extending between and connected to a respective signal receiver of the second plurality of signal receivers and to respective output device of the second plurality of output devices;
  the second set of output devices being associated with the sets of central ports or the sets of remote ports associated with the remote ports; and
  each output device of the second plurality of output devices being contained within the faceplate containing the set of remote ports associated with the output device.

17. The distribution system of claim 1 wherein the plurality of signal paths, the plurality of signal receivers, and the plurality of output devices are a first plurality of signal paths, a first plurality of signal receivers, and a first plurality of output devices respectively;
  the distribution system comprises a second plurality of signal paths, a second plurality of signal receivers, and a second plurality of output devices;
  each signal path of the second plurality of signal paths extending between and connected to a respective signal receiver of the second plurality of signal receivers and to respective output device of the second plurality of output devices;
  each signal receiver being disposed at a respective physical location associated with a respective output device of the first plurality of output devices and each output device being disposed at a respective physical location associated with the signal receiver of the first plurality of signal receivers that is connected to the respective output device of the first plurality of output devices.

18. The distribution system of claim 1 wherein each central port of the plurality of central ports is a circuit breaker, each remote port of the plurality of remote ports is an electrical socket, and the transmission lines connecting the circuit breakers and electrical sockets each comprise electrical conductors.

19. The distribution system of claim 1 wherein each set of remote ports of the plurality of sets of remote ports is contained within a respective faceplate; and
  each signal receiver or output device associated with a respective set of remote ports is contained within the faceplate containing the respective set of remote ports.

20. The distribution system of claim 1 wherein the plurality of transmission lines are each configured to transmit gases or liquids.

21. A method for identifying a subset of one or more central or remote ports connected to a subset of one or more remote or central ports in a distribution system having a plurality of central ports connected to a plurality of remote ports by respective transmission lines extending from the central ports to the remote ports, the method comprising the steps of:
  (a) injecting a signal into a signal path extending from a first location associated with the subset of one or more of the remote ports or the subset of one or more central ports to a second location associated with the other of the set of remote ports or the set of central ports, the signal line being physically separate from and not being attached to any one of the transmission lines, the plurality of central ports, and the plurality of remote ports; and
  (b) actuating an output device located at the second location while the signal is being injected into the signal path, the output device being configured to generate a visual, auditory, or tactile output signal when the signal is injected into the signal path whereby the output signal identifies the subset of ports at the second location.

* * * * *